US012584968B2

(12) United States Patent
Lüth

(10) Patent No.: US 12,584,968 B2
(45) Date of Patent: Mar. 24, 2026

(54) METHOD FOR MONITORING THE STATE OF A REDOX FLOW BATTERY SYSTEM

(71) Applicant: LIVA Power Management Systems GmbH, Frankfurt am Main (DE)

(72) Inventor: Thomas Lüth, Freiburg (DE)

(73) Assignee: LIVA Power Management Systems GmbH, Frankfurt am Main (DE)

( * ) Notice: Subject to any disclaimer, the term of this patent is extended or adjusted under 35 U.S.C. 154(b) by 424 days.

(21) Appl. No.: 18/043,954

(22) PCT Filed: Aug. 17, 2021

(86) PCT No.: PCT/EP2021/072826
§ 371 (c)(1),
(2) Date: Mar. 3, 2023

(87) PCT Pub. No.: WO2022/048904
PCT Pub. Date: Mar. 10, 2022

(65) Prior Publication Data
US 2023/0324466 A1 Oct. 12, 2023

(30) Foreign Application Priority Data
Sep. 4, 2020 (DE) ..................... 10 2020 123 170.9

(51) Int. Cl.
*G01R 31/3842* (2019.01)
*G01R 31/392* (2019.01)

(52) U.S. Cl.
CPC ....... *G01R 31/3842* (2019.01); *G01R 31/392* (2019.01)

(58) Field of Classification Search
CPC ... G01R 31/3842; G01R 31/392; Y02E 60/50; H01M 8/188; H01M 8/04201; H01M 8/04544; H01M 8/04858
See application file for complete search history.

(56) References Cited

U.S. PATENT DOCUMENTS

2011/0242855 A1* 10/2011 Jovcic ..................... H02M 3/07
363/17
2013/0269566 A1* 10/2013 Polen ..................... H01M 8/20
429/70
(Continued)

FOREIGN PATENT DOCUMENTS

DE 102014216289 A1 3/2016
DE 102016125720 A1 6/2018
(Continued)

OTHER PUBLICATIONS

Beyer et al., "Electrolyte Imbalance Determination of a Vanadium Redox Flow Battery by Potential-Step Analysis of the Initial Charging", European Chemical Societies Publishing ChemSusChem, vol. 13, 2020, pp. 2066-2071.
(Continued)

*Primary Examiner* — Catherine T. Rastovski
*Assistant Examiner* — Lal Ce Mang
(74) *Attorney, Agent, or Firm* — Knobbe, Martens, Olson & Bear, LLP

(57) ABSTRACT

A method for monitoring the state of a redox flow battery system that includes at least two battery modules connected in series. The method includes the following steps: S1: switching at least one battery module out of the series circuit; S2: discharging at least a partial volume of the electrolyte of the at least one battery module that was switched out of the series circuit in step S1, a potential difference being repeatedly detected, the potential difference being formed between a first potential of the negative (Continued)

electrolyte and a second potential of the positive electrolyte of the at least one battery module that was switched out of the circuit; S3: determining, from the potential difference values detected in step S2, the state of health of the at least one battery module that was switched out of the series circuit in step S1.

12 Claims, 6 Drawing Sheets

(56)　　　　　References Cited

U.S. PATENT DOCUMENTS

| | | | | |
|---|---|---|---|---|
| 2015/0056525 | A1 * | 2/2015 | Lee | H01M 8/188 |
| | | | | 429/409 |
| 2016/0049673 | A1 * | 2/2016 | Fukushima | H01M 8/04186 |
| | | | | 324/426 |
| 2017/0098849 | A1 * | 4/2017 | Kumamoto | H01M 8/04949 |
| 2020/0014310 | A1 * | 1/2020 | Helling | H02M 3/33569 |
| 2021/0226239 | A1 * | 7/2021 | Underwood | H01M 8/043 |

FOREIGN PATENT DOCUMENTS

| | | | | | |
|---|---|---|---|---|---|
| EP | 3790148 | A1 * | 3/2021 | .......... | H02M 7/4835 |
| JP | H03-127468 | A | 5/1991 | | |
| JP | H07-211357 | A | 8/1995 | | |
| JP | 2001292532 | A * | 10/2001 | ............ | Y02E 60/10 |
| JP | 2007-311210 | A | 11/2007 | | |
| JP | 2016-072167 | A | 5/2016 | | |
| JP | 2016-115394 | A | 6/2016 | | |
| KR | 1020180058258 | A | 6/2018 | | |
| KR | 10-2020-0053224 | A | 5/2020 | | |

OTHER PUBLICATIONS

International Search Report dated Dec. 13, 2021 in corresponding PCT Application No. PCT/EP2021/072826 in 2 pages.
Office Action issued in Japanese Patent Application No. 2023-514894 dated Jul. 1, 2025 in 5 pages.
Search Report issued in Japanese Patent Application No. 2023-514894 dated Jun. 25, 2025 in 23 pages.

* cited by examiner

METHOD FOR MONITORING THE STATE OF A REDOX FLOW BATTERY SYSTEM

FIELD AND BACKGROUND OF THE INVENTION

The invention relates to a method for operating a redox flow battery system, in particular on the basis of vanadium. The invention relates in particular to redox flow battery systems having a high output voltage. The operating method relates to the monitoring of the state of the battery system in relation to the state of health (SoH).

In order to obtain a high output voltage in redox flow battery systems, conventionally a plurality of cells is connected electrically in series. This arrangement is referred to as a stack. This cannot be continued as desired, however, since otherwise the shunt current caused by the electrolyte would become intolerably high. The output voltage can, however, be increased further when a plurality of stacks is connected in series, wherein each stack has a separate tank unit. Such a unit comprising a stack and an associated separate tank unit is referred to as a battery module. The series circuit of a plurality of battery modules is conventionally referred to as a string. The invention therefore relates to a battery system which comprises a plurality of battery modules, wherein the battery system is designed in such a way that, during charging and discharging of the system, the battery modules are connected in series, i.e. form a string.

The SoH of a redox flow battery system can be negatively influenced by various effects. An imbalance in the electrolyte which consists in an unequal ion concentration in the negative and positive electrolyte can negatively influence the SoH. Such an imbalance is generally described by the so-called average oxidation state (AOS). An AOS which deviates from +3.5 indicates such an imbalance. Such an imbalance can already exist from the beginning of operation or become greater over the course of the operation. The latter case can be caused by vanadium oxidation, further chemical side reactions and by the "crossover" at the membranes of the stacks. Such an imbalance of the electrolyte is also often referred to as a shift in the electrolyte. A further possibility for an imbalance of the electrolyte consists in that the volume of the negative electrolyte can deviate from the volume of the positive electrolyte. In this case, the total electrolyte volume of a battery module and/or the electrolyte volume located in the cells can have such a deviation. In the latter case, for example, an air bubble in one or more of the cells can be the cause. An imbalance caused by different electrolyte volume can also become greater over time.

It is known from the prior art that a shift in the electrolyte can be detected with the aid of an OCV cell and a reference cell (or three half-cells). In this case, OCV stands for the so-called "open circuit voltage" (see below). In this case, however, problems result which are caused by the possibly limited long-term stability of the reference cell (cf. WO 2018/237181 A1). In addition, an imbalance caused by different electrolyte volume cannot be detected with the aid of reference cells.

In addition, a method has been described in which an electrolyte imbalance has been determined when a redox flow battery is charged for the first time ("Electrolyte Imbalance Determination of a Vanadium Redox Flow Battery by Potential-Step Analysis of the Initial Charging", Kirstin Beyer, Jan grosse Austing, Barbara Satola, Timo Di Nardo, Marco Zobel, Carsten Agert in European Chemical Societies Publishing ChemSusChem 2020, 13, 2066-2071).

In this case, two potential steps which are separated from one another can be detected during the initial charging in the case of a shifted electrolyte, while in this case an ideal electrolyte has only one potential step. In this case, the temporal spacing between the two potential steps is a measure of the SoH (see primarily FIG. 1 to FIG. 3).

SUMMARY OF THE INVENTION

The Inventor has set himself the object of specifying a method for monitoring the state of a redox flow battery system which is capable of monitoring the state of health of the battery system during normal operation and in the process is capable of detecting all of the described types of electrolyte imbalance.

The object is achieved according to the invention by an embodiment corresponding to the independent claim. Further advantageous embodiments of the present invention can be gleaned from the dependent claims.

BRIEF DESCRIPTION OF THE FIGURES

The solutions according to the invention are explained below with reference to figures. The figures show in detail.

DETAILED DESCRIPTION OF THE INVENTION

Figure 1:
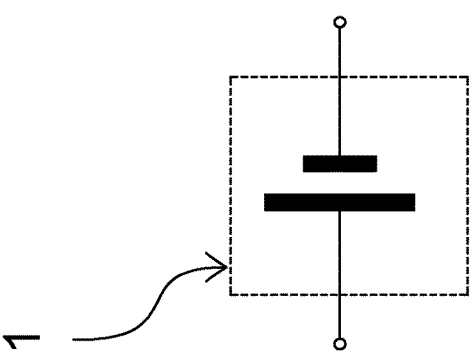
FIG. 1 battery module
FIG. 2 battery system in a first embodiment
FIG. 3 battery system in a further embodiment
FIG. 4 battery system in a further embodiment
FIG. 5 characteristic of potential difference values over time
FIG. 6 characteristic of potential difference values over time
FIG. 7 characteristic of potential difference values over time
Figure 1:
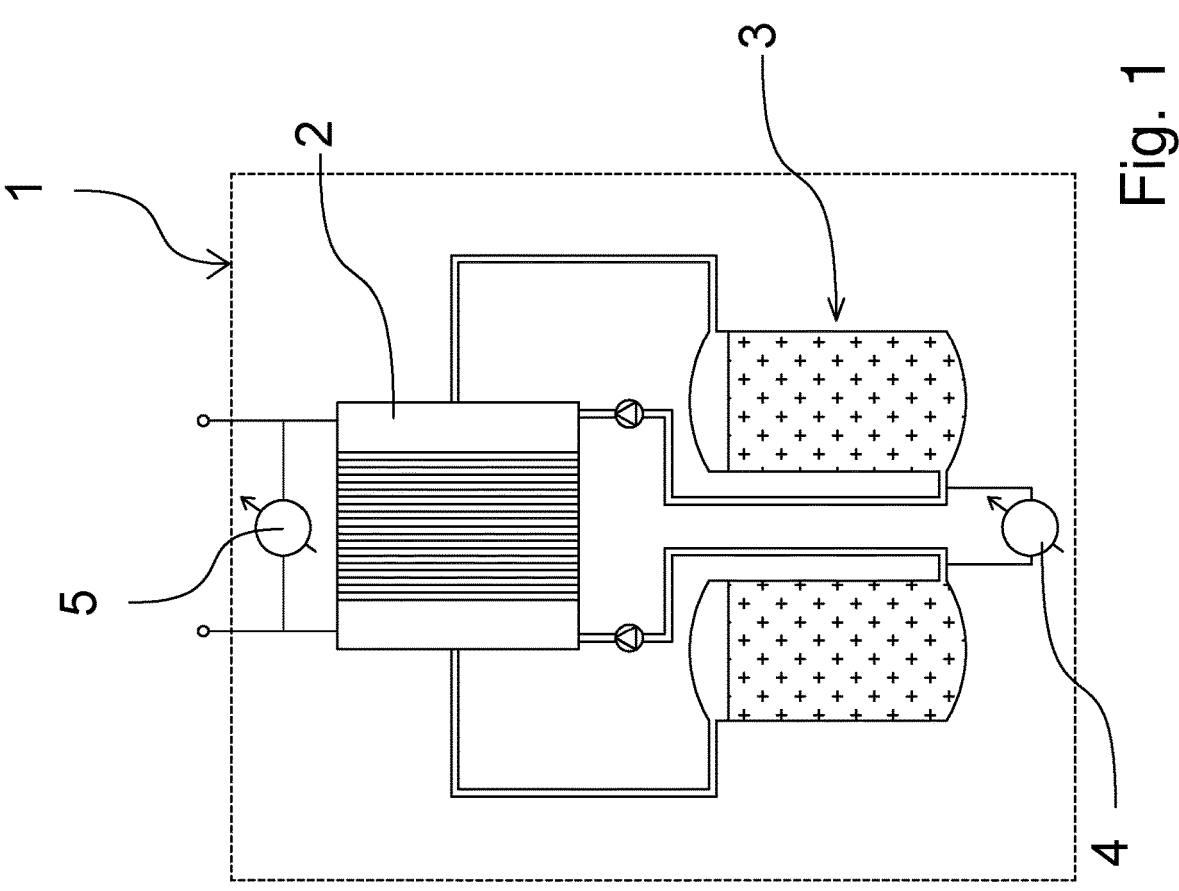

FIG. 1 shows, on the left-hand side in a schematic illustration, a battery module. The battery module is denoted by 1. The battery module comprises a cell arrangement, which is denoted by 2, and a tank device, which is denoted by 3. The cell arrangement 2 is an arrangement of a multiplicity of redox flow cells which can be arranged as desired. For example, they may be in the form of a single cell stack, a series circuit of a plurality of stacks, a parallel circuit of a plurality of stacks or a combination of a series circuit and a parallel circuit of a plurality of stacks. The tank device 3 serves to store the electrolyte and to supply electrolyte to the cell arrangement 2. For this purpose, the tank device 3 comprises at least two tanks for negative and positive electrolyte, a pipe system for connecting the tanks to the cell arrangement 2 and pumps for delivering the electrolyte. FIG. 1 shows in this case two separate pumps. It would be possible for the electrolyte to be delivered just as well using a double-headed pump, i.e. using two pumps which are driven via a common motor. The tank device 3 is in this case designed in such a way that it can supply electrolyte to all of the cells of the cell arrangement 2. If the pumps deliver the electrolyte, therefore, said electrolyte flows through all of the cells of the cell arrangement 2.

The battery module 1 illustrated in FIG. 1 comprises two measuring devices, which are denoted by 4 and 5. The measuring device which is denoted by 4 is a measuring device for providing the so-called open-circuit voltage (OCV). The OCV value is a measure of the state of charge (SoC) of the battery module. The measuring device which is denoted by 5 is a measuring device for providing the terminal voltage of the cell arrangement 2 and therefore also of the battery module 1. During charging or discharging of the battery module 1, the terminal voltage differs from the open-circuit voltage by the voltage drop across the internal resistance of the cell arrangement 2. The two measuring devices 4 and 5 are used to measure a potential difference which is formed in each case between a first potential of the negative electrolyte and a second potential of the positive electrolyte. In the case of the OCV measuring device 4, the electrodes which tap off the mentioned potentials are located in a measurement cell, wherein the associated chambers in which negative and positive electrolyte are located are separated by a membrane or a separator. In the case of the measuring device 5 for providing the terminal voltage, the electrodes for tapping off the mentioned potentials are located in corresponding cells of the cell arrangement 2. Of course in this case the potential difference formed is dependent on the number of cells which are connected in series between the electrodes for tapping off the potentials. When there is no charging current or discharge current flowing, the terminal voltage is a multiple of the potential which is tapped off at the OCV measuring device, wherein the associated factor is given by the number of cells which are connected in series in the cell arrangement 2.

A symbolic representation of the battery module 1 is shown on the right-hand side in FIG. 1. This symbolic representation is used in the text which follows.

Figure 2:
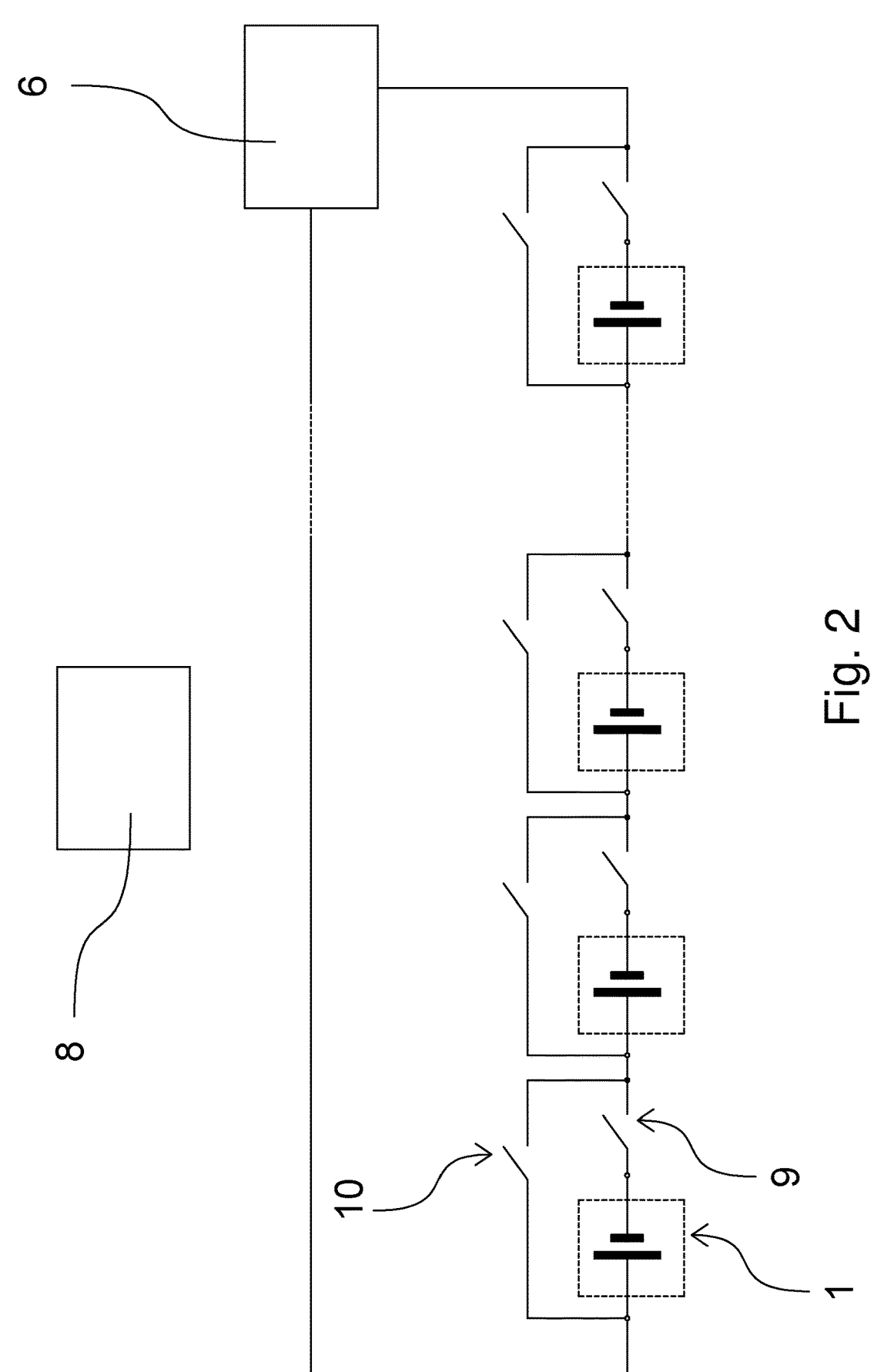

FIG. 2 shows a schematic illustration of a battery system in a first embodiment. The battery system comprises at least two battery modules, of which one is denoted by 1, a bidirectional converter (bidirectional power conversion system—PCS), which is denoted by 6, and a control device, which is denoted by 8. The battery modules 1 are connected in series and are connected to the converter 6. Four battery modules are illustrated in FIG. 2, wherein the dashed lines in the series circuit are intended to indicate any desired number of further modules. The converter 6 takes on the link between the battery system and the power supply system or a superordinate electrical system. The battery system further comprises, for each battery module 1, a first switch, of which one is denoted by 9, and a second switch, of which one is denoted by 10. The first switches 9 are each arranged in series with the battery modules 1, wherein it is of course of little significance on which side of the respective battery module the associated switch 9 is arranged. The second switches 10 are each arranged in a bypass line around in each case one battery module 1 and the associated first switch 9. In FIG. 2, all of the switches 9 and 10 are illustrated as being in the open state. The switches are, however, actuated by the control device 8 in such a way that, of each switch pair comprising a first and a second switch, precisely one switch is closed and one switch is open (alternately open and closed). That is to say that a switch pair in this case has precisely two switch positions, wherein, in the first switch position (first switch 9 closed and second switch 10 open), the associated battery module 1 is located in the series circuit of the battery system, and, in the second switch position (first switch 9 open and second switch 10 closed), the associated battery module 1 is isolated from the series circuit of the battery system by the bypass line. The opening of the first switch 9 when the switch 10 is closed in this case prevents the discharge of the module via the bypass line. The control device 8 is connected to each battery module in such a way that it can detect the measured values of the measuring devices 4 and 5. In addition, the control device 8 is connected to each of the switches 9 and 10 in such a way that it can determine the respective switch position in order to switch the battery modules 1 into or out of the series circuit. These connections can also take place wirelessly.

The arrangement shown in FIG. 2 represents the minimal configuration for the implementation of the operating method according to the invention. It will be mentioned here that in most embodiments of the operating method according to the invention only the terminal voltage of the battery modules 1 is measured. That is to say that in these embodiments it is not necessary that the battery modules 1 also comprise a measuring device for detecting the OCV.

Figure 3:
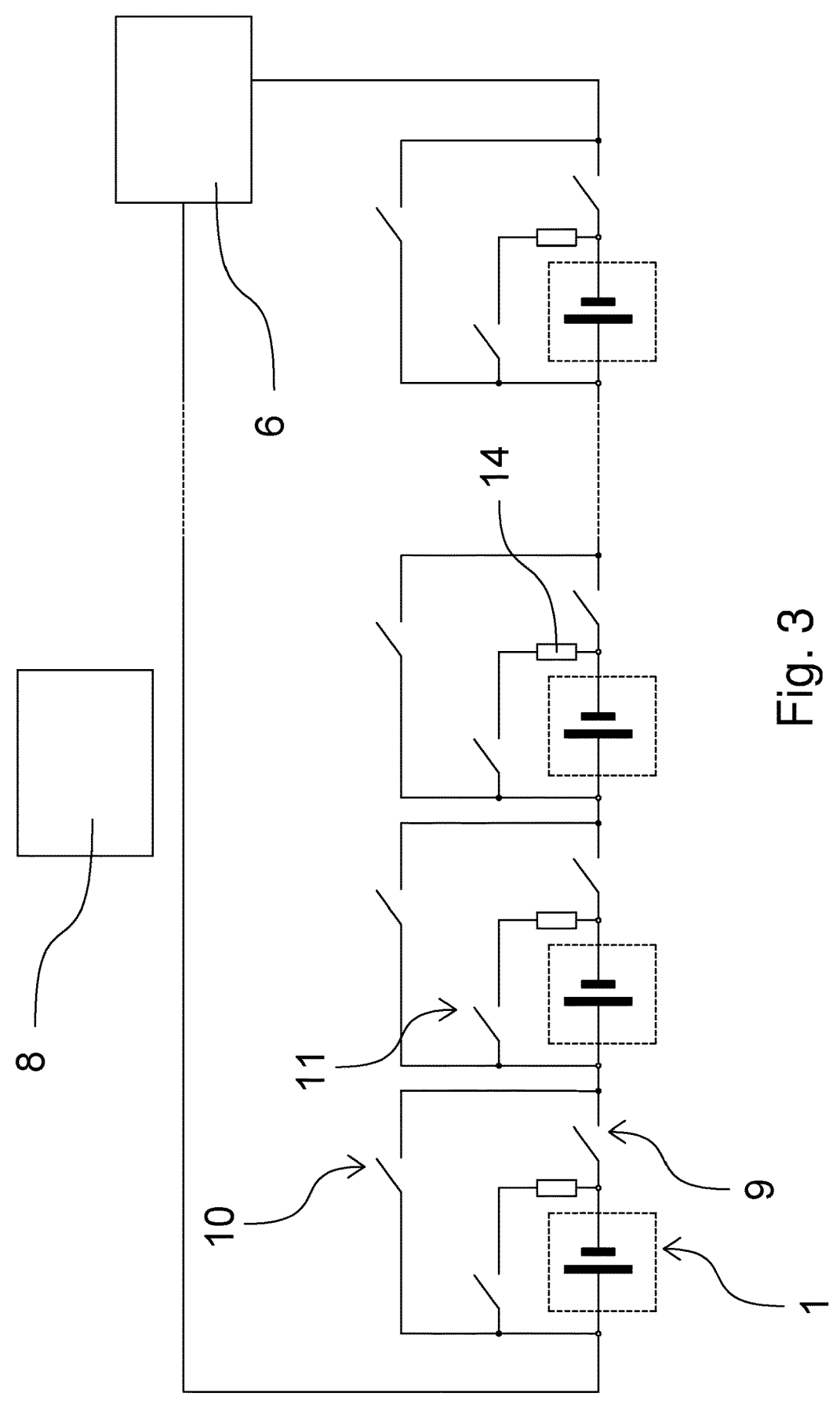

FIG. 3 shows a battery system according to the invention in a further embodiment. The battery system comprises, for each battery module 1, in addition a further, i.e. third, switch, of which one is denoted by 11. In addition, the battery system comprises, for each battery module 1, a resistor, of which one is denoted by 14. The third switch 11 and the resistor 14 are in this case in each case arranged in a further bypass line around in each case one battery module 1 in such a way that in each case one battery module 1 is short-circuited via a resistor 14 when the associated third switch 11 is closed. The third switches 11 are also actuated by the control device 8. With the aid of the arrangement in FIG. 3, each battery module can be selectively discharged via an associated resistor 14 by closing the associated third switch 11.

Figure 4:
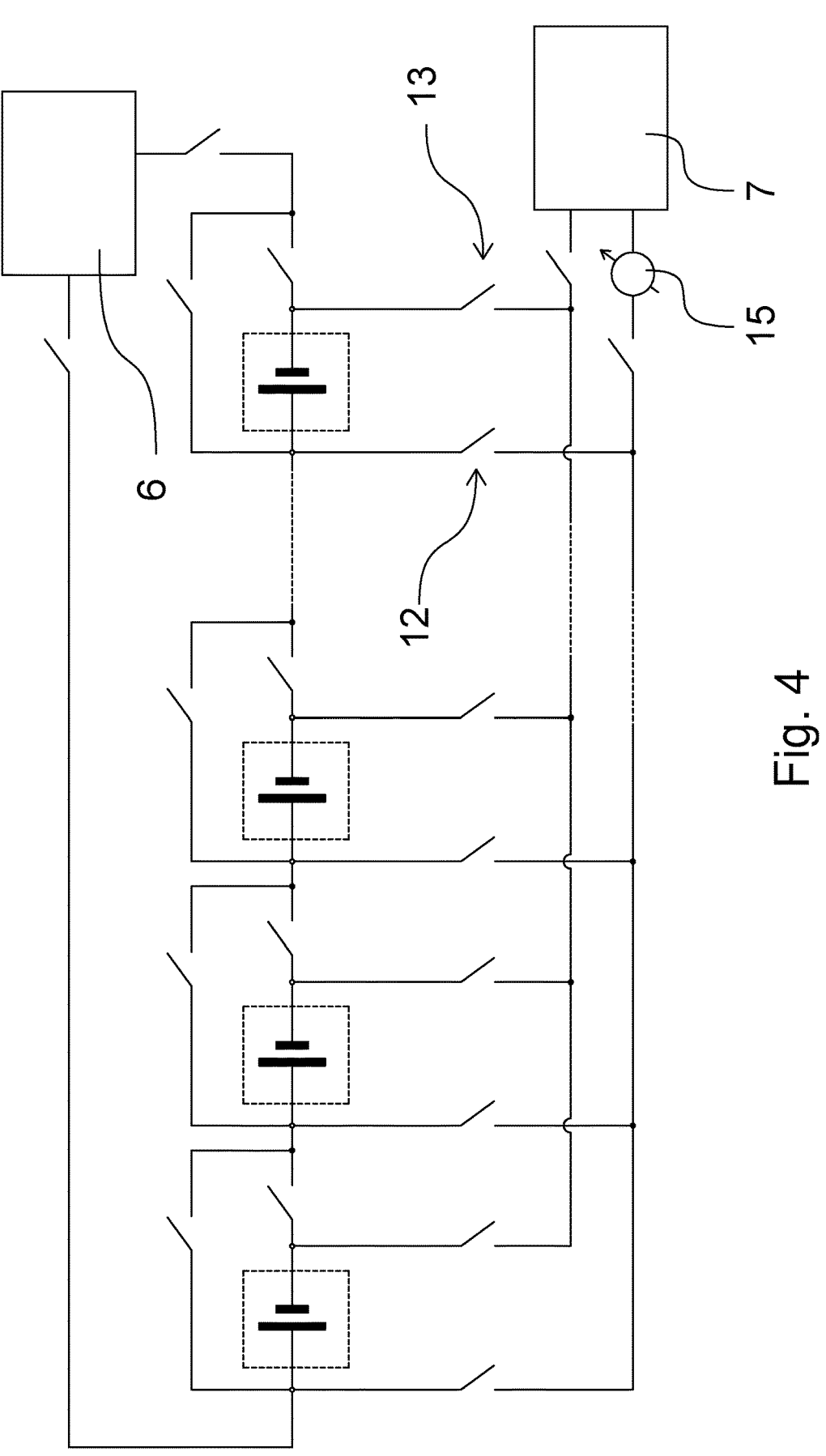

FIG. 4 shows a battery system according to the invention in a further embodiment. The battery system comprises a further converter, which is denoted by 7. In addition, the battery system comprises, for each battery module, in addition a fourth and fifth switch, which are denoted by 12 and 13, and lines, wherein the additional switches and the lines are connected to one another and to the battery modules in such a way that each battery module 1 can be connected separately to the further converter 7. The additional switches 12 and 13 are also actuated in this case by the control device, which is not illustrated in FIG. 4 for space reasons. FIG. 4 also shows yet further switches by means of which the converters 6 and 7 can be electrically isolated in each case from the rest of the arrangement. This can be advantageous. Possibly only one switch disconnector can also be used per converter. Such switches can likewise be used in all other embodiments. It will also be mentioned that the designations "fourth" and "fifth" switches are due simply to clarity and do not imply that in one embodiment with these switches "third" switches also necessarily need to be present. The embodiment in FIG. 4 enables discharge of the individual battery modules 1 via the further converter 7. For this purpose, it is sufficient that the further converter 7 is designed to be unidirectional. However, it can also be designed to be bidirectional, with the result that it can also be used for charging the individual battery modules 1, which can be useful, for example, for SoC balancing of the string or for precharging of the battery modules 1.

The Inventor has been guided by the concept that the SoH of a battery system is dependent on the SoHs of the individual battery modules. In addition, the Inventor has identified that it is possible to monitor the SoH of a battery module even during discharge with the aid of the potential steps described in the document cited at the outset. The method according to the invention comprises the following steps:

S1: driving the first and second switches 9, 10 in such a way that at least one battery module 1 is switched out of the series circuit;

S2: discharging at least a subvolume of the electrolyte of the at least one battery module 1 which has been switched out of the series circuit in step S1, wherein a potential difference is detected repeatedly, and wherein the potential difference is formed between a first potential of the negative electrolyte and a second potential of the positive electrolyte of the at least one switched-out battery module 1;

S3: determining the SoH of the at least one battery module which has been switched out of the series circuit in step S1 from the potential difference values detected in step S2.

In this case, in respect of step S2 it should be noted that the mathematical sign of the potential difference formed makes no difference, i.e. the potential difference can be formed just as well between a first potential of the positive electrolyte and a second potential of the negative electrolyte of the at least one switched-out battery module 1. Or in other words: Only the absolute value of the potential difference is of any significance.

Depending on the design of the battery system, in this case step S2 can proceed differently. When the battery system is designed as shown in FIG. 2, the discharge process takes place in the form of a self-discharge of the at least one battery module 1 which has been switched out in step S1. Since such a self-discharge proceeds relatively slowly, it is advantageous if the battery module(s) 1 in question during the switching-out process in step 1 is/are already close to the state of charge in which the potential steps to be detected occur. This is the case when the OCV value of the battery module in question is 1.4 volts or less. A corresponding criterion can be derived from the terminal voltage.

When the battery system is designed as shown in FIG. 3, the discharge process of the at least one battery module 1 which has been switched out in step S1 takes place by virtue of the fact that the associated third switch 11 is closed, with the result that the battery module in question is discharged via the associated resistor 14. As a result, the discharge process can proceed correspondingly more quickly, with the result that the determination of the SoH takes less time.

In the cases mentioned in the two previous paragraphs, the energy converted during discharge is ultimately converted into heat, i.e. is lost. Therefore, it is also advantageous for this reason if the battery module(s) 1 in question during the switching-out process in step 1 is/are already close to the state of charge in which the potential steps to be detected occur. A further particular feature of the mentioned cases consists in that, in principle, more than one battery module 1 can be switched out of the series circuit of the battery system in step S1, with the result that, in steps S2-S4, the SoH of these modules can be determined simultaneously. The number of modules monitored simultaneously in this way is upwardly limited by virtue of the fact that the battery system must be capable of ensuring normal operation in the time required for the SoH determination. Existing high-voltage battery systems can compensate for the switching-out of one battery module in each operating state. In some operating states, for example when it is foreseeable that, in the time that the SoH determination requires, no power consumption or power output of the battery system needs to take place, it is also possible for more than one battery module to be switched out of the series circuit without any problems for the SoH determination.

When the battery system is designed as shown in FIG. 4, the discharge process of the at least one battery module 1 which has been switched out in step S1 takes place by virtue of the fact that the associated fourth and fifth switches 12 and 13 are closed, and the discharge is managed via the further converter 7. In this configuration, only ever precisely one battery module can be switched out and connected to the further converter in order to determine the associated SoH in this way. The advantage of this configuration consists in that the energy that is converted during discharge is not lost since it is fed via the further converter 7 into the superordinate power supply system. Therefore, the SoH determination can be started largely independently of the respectively present SoC of the battery module in question. When the SoC is still far above the range of interest for the SoH determination, the discharge of the battery module in question can take place via the further converter 7 at a high discharge current until the OCV value has reached the abovementioned 1.4 volts mark. Thereafter, the discharge can take place at a lower current, with the result that a sufficiently high resolution of the potential steps is ensured. As a result, the SoH determination can proceed more quickly and with fewer side reactions.

In principle, any desired combination of the embodiments according to FIGS. 2 to 4 is conceivable. Thus, for example, one module could be discharged via the further converter 7 and another module could be discharged simultaneously via the associated resistor 14, wherein the SoH of the modules in question is determined.

Further variants of the method according to the invention result depending on which subvolume of the electrolyte of the battery module in question is discharged in step S2. These variants are closely linked to the respective purpose of the SoH determination.

When a volume deviation of the entire electrolyte, i.e. a deviation between the volume of negative electrolyte and the volume of positive electrolyte, is intended to be determined, the entire electrolyte of the battery module in question must also be discharged in step S2. This is achieved by virtue of the fact that, during the implementation of step S2, the electrolyte flow through the cell arrangement 2 is adjusted via the pump power in such a way that a superstoichiometric flow results. In this variant, the detection of the potential difference in step S2 can take place either with the OCV cell 4 or with the measuring device for detecting the terminal voltage 5. It is clear that this variant is time-consuming since a correspondingly large amount of energy needs to be converted during discharge. In combination with the variant shown in FIGS. 2 and 3, therefore, a large amount of energy is also lost, with the result that these combinations are markedly less advantageous than the combination with the variant shown in FIG. 4.

When a shift in the electrolyte is intended to be detected, it is sufficient, in step S2, to discharge the subvolume of electrolyte contained in the cell arrangement 2 and to thereby use it for the SoH determination. This is achieved by virtue of the fact that, during the implementation of step S2, the electrolyte flow through the cell arrangement 2 is either completely suppressed (by ceasing the pumping) or is adjusted via the pump power in such a way that a substoichiometric flow results. In this variant, the detection of the potential difference in step S2 needs to take place using the measuring device for detecting the terminal voltage 5. This variant is also suitable for detecting an air bubble in the cell arrangement 2. A combination with the variants according to FIGS. 2-4 is advantageously possible.

It is in principle also possible to only discharge the subvolume which is contained in the OCV cell 4 in step S2 and thereby use it for the SoH determination. In this variant, the detection of the potential difference in step S2 takes place using the OCV cell 4 itself. However, the disadvantage results that the SoH determination in this way lasts a long time since the discharge is very slow owing to very low short-circuit currents.

In respect of the determination of the SoH in step S3, the following needs to be said: The SoH can in this case be determined absolutely or relatively.

The absolute determination of the SoH takes place via the determination of the potential steps in accordance with the document mentioned at the outset "Electrolyte Imbalance Determination of a Vanadium Redox Flow Battery by Potential-Step Analysis of the Initial Charging". The potential steps result when the potential difference values detected in step S2 are considered as a function of time. In order to determine the precise temporal position of the step, in this case the curve can be differentiated. For the absolute determination of the SoH, it is also necessary to quantify the energy which is converted during discharge between the two potential steps. For this purpose, it is necessary to measure the absolute value of the discharge current. By integration of the discharge current curve over time, the transferred charge results. In the case of a constant discharge current, the charging is proportional to the time that has elapsed between the potential steps. The converted energy is in turn given by integration of the potential differences as a function of the transferred charge. For the absolute determination of the SoH, the battery system therefore comprises a measuring device for determining the discharge current intensity present in step S2. Depending on the design of the battery system, this measuring device can be arranged differently. FIG. 4 shows, by way of example, a measuring device for determining the discharge current intensity, which is denoted by 15. In other embodiments, such as, for example, the embodiment shown in FIG. 3, the battery system can comprise, for each battery module, a separate measuring device for determining the discharge current intensity. In the embodiment shown in FIG. 3, this would be arranged in series with the resistors 14.

For the relative determination of the SoH, the presently recorded potential difference curve can be compared with a previously recorded reference curve (see below). A further possibility consists in considering only the elapsed time between the two steps in the case of the potential difference curves as SoH parameter. This case could also be referred to as qualitative determination of the SoH since only one parameter is determined which is in relation to the actual (i.e. quantitatively determined) SoH. Also, an SoH parameter determined in this way enables a relative SoH determination.

Figure 5:
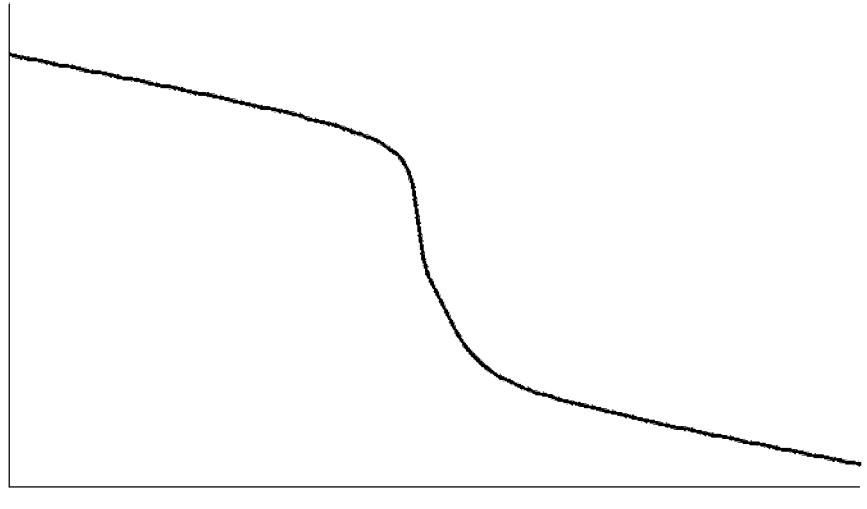
Figure 6:
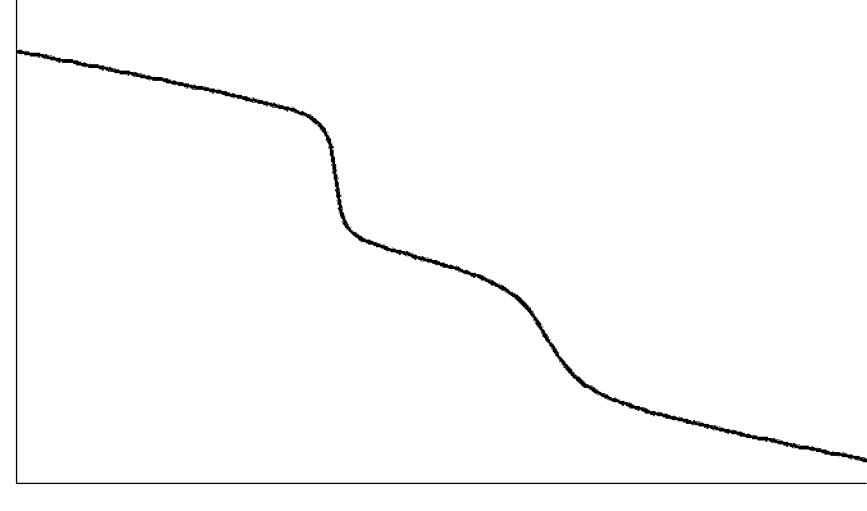
Figure 7:

FIGS. 5 to 7 show, by way of example, the characteristic over time of the potential difference values detected in step S2 in order to clarify the determination of the SoH. That is to say that the x axis in this graph is time, and the y axis is the detected potential difference values. In the curve illustrated in FIG. 5, substantially only one potential step can be seen. The associated electrolyte is therefore balanced well (AOS=3.5). In FIG. 6, the curve shows two potential steps, wherein the chronologically first step is steeper than the chronologically subsequent potential step. The associated electrolyte is not well balanced, and the AOS is less than 3.5. The curve illustrated in FIG. 7 also has two potential steps, wherein the chronological sequence is reversed in comparison with FIG. 6. The associated electrolyte is not well balanced, and the AOS is greater than 3.5. With knowledge of the discharge current intensity, the associated AOS value can be calculated from the temporal spacing between the two potential steps, with the result that the SoH can be determined absolutely. Often, it is also sufficient to determine the SoH relatively, for example in order to decide when the electrolyte needs to be regenerated in a battery module. For this purpose, many suitable metrics can be used. For example, the detected potential difference curves could be compared with a corresponding reference curve, which has been recorded during first use or after a preceding regeneration of the electrolyte. A suitable measure of the deviation between the two curves would then be, for example, the sum of the squares of the differences. For this purpose, a person skilled in the art can find further suitable metrics without any problems.

In the above-described method according to the invention, in each case at least a subvolume of electrolyte of a battery module is discharged. As a result, the state of charge of the battery module in question naturally also changes (i.e. decreases). If it were to be desired to prevent this, a corresponding amount of energy can be supplied to the battery module in question prior to or after the implementation of the described method, with the result that the state of charge of the battery module is not ultimately changed by the implementation of the method. The supply of energy can in this case, in the configuration shown in FIG. 4, advantageously take place by means of the further converter 7.

Finally, it will be mentioned that, in step S2, the discharge can be terminated when a sufficient amount of potential difference values has been recorded in order to be able to determine the SoH in step S3. In order to establish a termination criterion for the discharge in step S2, it is therefore advantageous when steps S2 and S3 proceed at least partially in parallel, i.e. when the evaluation of the recorded potential difference values already begins while yet further potential difference values are being recorded. Step S2 can be terminated when step S3 produces one of the following results:

detection of a potential step having a step level that exceeds a predefined threshold value;

detection of two potential steps.

In this case, all of the values which are within the OCV equivalence range of between 0.7 and 1.2 volts are suitable as threshold values for the first criterion. Particularly advantageous are threshold values from the OCV equivalence range of from 0.8 to 1.1 volts. The use of a termination criterion for step S2 has the advantage that the method according to the invention can be implemented more quickly. The use of modern computation systems enables the determination of the SoH in step S3 in a negligible amount of time.

In this case it is clear that the threshold values mentioned in the preceding paragraph apply to battery systems based on vanadium. Other threshold values generally apply to other battery systems. The same applies for the abovementioned AOS values.

LIST OF REFERENCE SYMBOLS 1 battery module
2 cell arrangement
3 tank device
4 measuring device for determining the OCV (OCV cell)
5 measuring device for determining the terminal voltage
6 bidirectional converter (PCS)
7 further converter
8 control device
9 first switch
10 second switch
11 third switch
12 fourth switch 13 fifth switch 14 resistor 15 measuring device for determining the discharge current intensity

The invention claimed is:

1. A method for monitoring a state of a redox flow battery system, the method comprising:

providing a battery system with at least two battery modules, a bidirectional converter, and a control device, wherein the at least two battery modules are connected in a series circuit and are connected to the bidirectional converter, and wherein each of the at least two battery modules includes a cell arrangement having a multiplicity of redox flow cells and a tank device for storing electrolytes including a negatively-charged electrolyte and a positively-charged electrolyte and for supplying the electrolytes to the cell arrangement, the battery system further including, for each of the at least two battery modules, a first switch arranged in series with the respective battery module, and a second switch arranged in a bypass line around the respective battery module and the first switch, and the control device being connected to each of the first and second switches configured for determining a respective switch position in order to switch the at least two battery modules into or out of the series circuit;

step S1: driving the first and second switches in such a way that at least one battery module is switched out of the series circuit;

step S2: discharging at least a sub-volume of the electrolytes of the at least one battery module which has been switched out of the series circuit in step S1, repeatedly detecting by the control device a potential difference using a measuring device connected to the control device and the at least two battery modules, the potential difference being formed between a first potential of the negatively-charged electrolyte and a second potential of the positively-charged electrolyte of the at least one switched-out battery module;

step S3: determining by the control device a State of Health, SoH, of the at least one battery module which has been switched out of the series circuit in step S1 from the potential difference detected by the control device in step S2; and implementing steps S2 and S3 at least partially in parallel with one another, and terminating by the control device step S2 when step S3 produces one of the following results:

detection by the control device of a potential step having a step level that exceeds a predefined threshold value, the predefined threshold value lying within an open circuit voltage, OCV, equivalence range of from 0.7 to 1.2 volts; or detection by the control device of two potential steps.

2. The method according to claim 1, wherein the battery system comprises, for each battery module, a third switch and a resistor, wherein the third switch and the resistor are each arranged in a bypass line around in each case one battery module in such a way that in each case one battery module is short-circuited via a resistor when the third switch of the one battery module is closed, and wherein the discharging of the electrolytes in step S2 takes place via the resistor.

3. The method according to claim 1, wherein the battery system comprises a further converter and a fourth switch and a fifth switch and lines for each of the at least two battery modules, wherein the fourth and fifth switches and the lines are connected to one another and to the at least two battery modules in such a way that each battery module can be connected separately to the further converter, and wherein the discharging of the electrolytes in step S2 takes place via the further converter.

4. The method according to claim 1, wherein each of the at least two battery modules comprises a measuring device for determining the OCV, and wherein detecting the potential difference in step S2 is effected by way of the measuring device for determining the OCV.

5. The method according to claim 4, which comprises, in step 2, discharging an entire electrolyte volume of the at least one battery module which has been switched out of the series circuit in step S1.

6. The method according to claim 1, wherein each of the at least two battery modules comprises a measuring device for determining a terminal voltage, and wherein detecting the potential difference in step S2 is effected by way of the measuring device for determining the terminal voltage.

7. The method according to claim 6, which comprises, in step 2, discharging an entire electrolyte volume of the at least one battery module which has been switched out of the series circuit in step S1.

8. The method according to claim 6, which comprises, in step S2, discharging an electrolyte volume contained in the cell arrangement of the at least one battery module which has been switched out of the series circuit in step S1.

9. The method according to claim 1, which comprises measuring a current intensity of a discharge current in step S2 with the measuring device of the battery system.

10. The method according to claim 1, which comprises setting the predefined threshold value within an OCV equivalence range of from 0.8 to 1.1 volts.

11. The method according to claim 1, which comprises, in step S3, determining the SoH relatively by comparison with a reference potential difference curve.

12. The method according to claim 1, which comprises, in step S3, determining the SoH by determining a time that has elapsed between two steps in a detected potential difference curve.

* * * * *